United States Patent [19]

Agoston

[11] Patent Number: 4,812,769

[45] Date of Patent: Mar. 14, 1989

[54] PROGRAMMABLE SAMPLING TIME BASE CIRCUIT

[75] Inventor: Agoston Agoston, Beaverton, Oreg.

[73] Assignee: Tektronix, Inc., Beaverton, Oreg.

[21] Appl. No.: 858,490

[22] Filed: Apr. 30, 1986

[51] Int. Cl.$^4$ .................... H03K 5/04; H03K 3/017
[52] U.S. Cl. ........................................ 328/63; 328/58;
       307/265; 307/269
[58] Field of Search ................... 328/109, 111, 63, 72,
       328/129.1, 58, 59, 74, 151, 136, 141; 307/227,
       228, 234, 269, 265, 271

[56] References Cited

U.S. PATENT DOCUMENTS

| | | | |
|---|---|---|---|
| 3,646,370 | 2/1972 | Lowe | 328/58 |
| 4,415,861 | 11/1983 | Palmquist et al. | 307/265 |
| 4,629,915 | 12/1986 | Suzuki et al. | 307/265 |
| 4,717,883 | 1/1988 | Browning | 328/151 |

Primary Examiner—Stanley D. Miller
Assistant Examiner—Timothy P. Callahan
Attorney, Agent, or Firm—Daniel J. Bedell; Robert S. Hulse

[57] ABSTRACT

A time base circuit for a waveform sampling system produces a strobe signal for initiating waveform sampling an adjustable strobe delay time following detection of a triggering event in a waveform. The time base circuit includes a strobe control circuit for producing the strobe signal and a strobe sense signal in response to a strobe drive signal, a strobe drive circuit for generating the strove drive signal, an adjustable time after a trigger signal, and a trigger generator for producing the trigger signal in selective response to either the triggering event in the waveform or the strobe sense signal. The strobe signal delay time is calibrated by setting the trigger generator to produce the trigger signal in response to the strobe sense signal thereby causing the strobe drive circuit to generate the strobe drive signal periodically. A period timer measures the period between successive strobe drive signals and a microprocessor adjusts the delay time of the strobe drive circuit so that the period between strobe drive signals is equal a predetermined delay time.

7 Claims, 1 Drawing Sheet

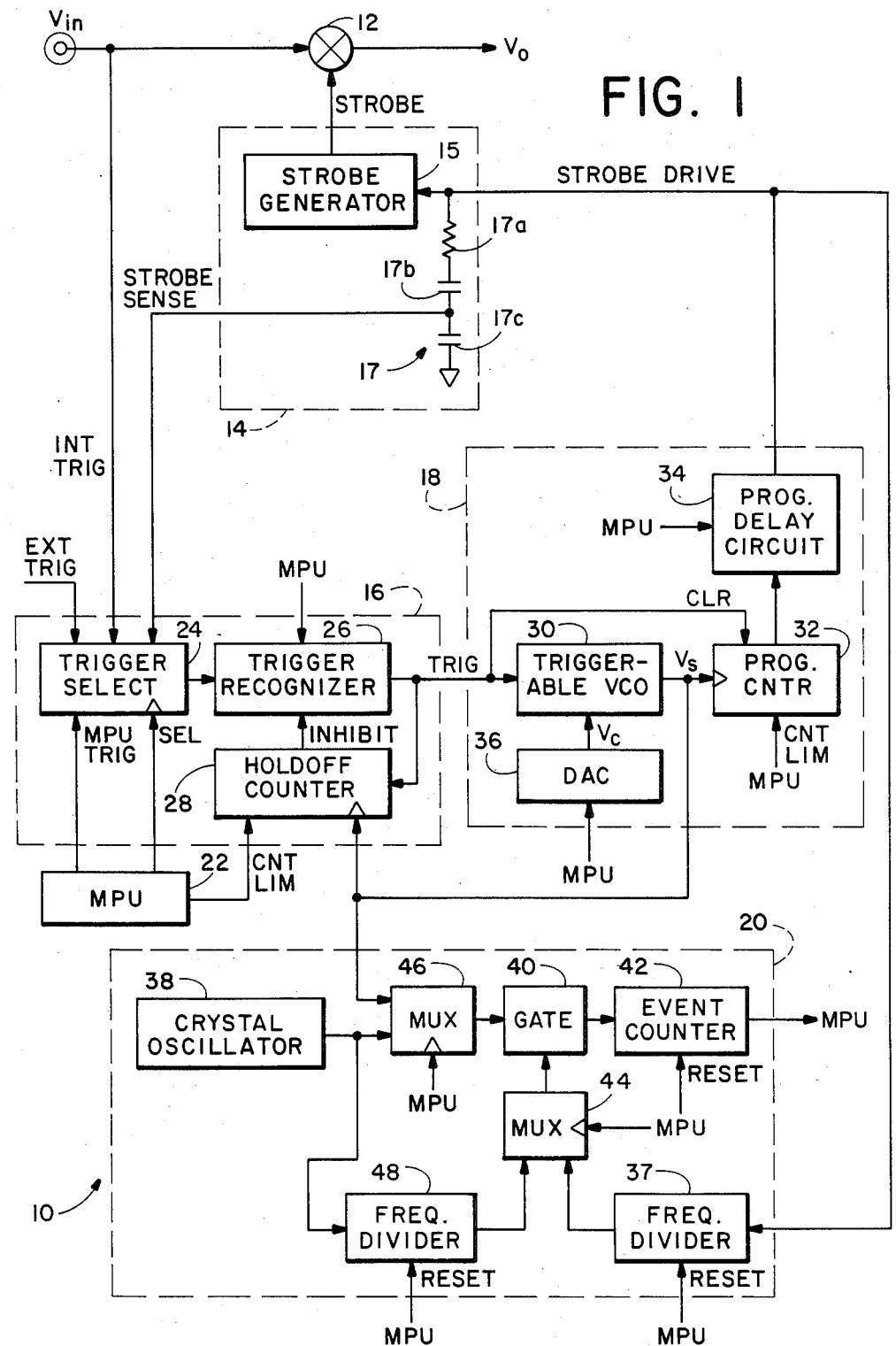

PROGRAMMABLE SAMPLING TIME BASE CIRCUIT

BACKGROUND OF THE INVENTION

The present invention relates in general to a time base circuit for producing a sampling strobe signal in a waveform sampling system and in particular to a time base circuit which provides for an accurately adjustable delay time between a triggering event and the strobe signal.

Waveform sampling systems typically utilize a strobed sampling gate to sample an input waveform and it is desirable that a strobe signal controlling gate operation be generated a predetermined delay time following a triggering event, such as a zero crossing in the waveform being sampled. For example an averaging sampling system samples a periodic waveform at a similar point along several repetitive sections of the waveform in order to determine an average value of the waveform at that point. To ensure that the waveform is sampled at the same point along each repetitive section of the waveform, each successive strobe signal should be generated at the same relative time with respect to a repetitive triggering event in each section of the waveform. As another example, an "equivalent time" sampling system samples several points at regular intervals along successive sections of a repetitive waveform by progressively increasing the strobe signal delay by regular, predetermined amounts after each repetitive triggering event in the waveform. This enables the sampling system to obtain samples representing several point along one cycle of the waveform even though the frequency of the waveform is relatively high compared to the sampling rate of the system.

The accuracy of averaging and equivalent time sampling depends on the accuracy with which the delay between the triggering event and the sampling strobe signal can be controlled. In sampling system time base circuits of the prior art, the input waveform is applied to a trigger generator which produces a trigger signal on detection of the triggering event in the waveform. The trigger produced by the trigger recognizer is then delayed by a programmable delay circuit before being applied to a strobe signal generator and the strobe signal generator produces the strobe signal in response to the strobe drive signal. The time delay between the trigger signal and the strobe signal is controlled by programming the delay circuit, taking into account any inherent time delay in the operation of the trigger recognizer circuit. However the inherent operating time delay associated with the trigger generator and the programmable time delay of the delay circuit are influenced by ambient temperature fluctuations and therefore the timing of successive strobe signals with respect to successive triggering events can vary with time. What is needed and would be useful is a method and apparatus for continuously and rapidly recalibrating the sampling delay time.

SUMMARY OF THE INVENTION

In accordance with one aspect of the invention, a time base circuit for a waveform sampling system produces a strobe signal an adjustable strobe delay time following a triggering event in an input waveform to be sampled, the strobe signal controlling the time of input waveform sampling. The time base circuit includes a strobe control circuit for producing both the strobe signal and a strobe sense signal in response to a strobe drive signal. The time base circuit also includes a trigger generator for producing a trigger signal selectively either upon detection of the triggering event or upon detection of the strobe sense signal. The trigger signal is applied to a strobe drive circuit which produces the strobe drive signal an adjustable delay time following the trigger signal. During a sampling operation, the trigger generator initiates the trigger signal in response to the triggering event as the initiating event and the strobe drive circuit produces a single strobe drive signal in response to the trigger signal but delayed thereafter by an adjustable delay time. The strobe control circuit then generates a single strobe signal to initiate sampling of the input waveform.

To calibrate the delay time between the triggering event and the strobe signal, the trigger generator is set to produce the trigger signal in response to the strobe sense signal rather than in response to the triggering event. The trigger signal initiates a strobe drive signal, which in turn initiates another strobe sense signal which in turn initiates yet another trigger signal. Thus, the time-base circuit acts as an oscillator producing trigger, strobe drive and strobe sense signals periodically. The period between successive strobe drive signals is measured by a period timer which provides measurement data to a microprocessor and the microprocessor adjusts the delay time of the strobe drive circuit to adjust the period between successive strobe drive signals to a predetermined delay time. When the timing circuit is calibrated in this fashion between sampling operations, fluctuations in strobe signal timing due to ambient temperature variations and other destabilizing effects are substantially eliminated.

According to another aspect of the invention, the strobe drive circuit includes a voltage controlled oscillator for generating a periodic output signal triggered by the trigger signal and a programmable counter for producing an output pulse an adjustable number of oscillator output signal cycles following the trigger signal. The counter output pulse is delayed by a programmable delay circuit to provide the strobe drive signal. The microprocessor grossly adjusts the strobe signal delay by adjusting the number of oscillator output signal cycles to be counted and finely adjusts the strobe signal delay by adjusting the pulse delay time of the programmable delay circuit.

According to a further aspect of the invention, the period timer also measures the period of the voltage controlled oscillator output signal utilizing a crystal controlled oscillator as a references source. The microprocessor adjusts the voltage controlled oscillator frequency after each period measurement to compensate for frequency fluctuations due to ambient temperature changes and other destabilizing effects.

It is accordingly an object of the invention to provide a new and improved time base circuit for a waveform sampling system for providing a strobe signal an adjustable strobe signal delay time following a triggering event in a waveform to be sampled.

It is another object of the invention to provide such a new and improved time base circuit wherein the strobe signal delay time may be accurately calibrated.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings.

DRAWINGS

FIG. 1 is a block diagram of a programmable time base circuit according to the present invention.

DETAILED DESCRIPTION

Referring to FIG. 1, a programmable time base circuit 10, depicted in block diagram form is adapted to produce a sampling strobe signal an adjustable delay time following a triggering event in an input waveform Vin. The strobe signal controls the operation of a sampling gate 12 which samples the input waveform Vin to produce an output waveform sample voltage Vo on receipt of the strobe signal. Such a sampling gate may be used, for example, in a digital oscilloscope or a waveform digitizer to sample an input waveform at selected times relative to the triggering event. The time base circuit 10 includes a strobe control circuit 14 for producing both the strobe signal and a "strobe sense" signal in response to a "strobe drive" signal. The strobe control circuit 14 includes a strobe generator 15 adapted to produce a short strobe pulse on receipt of the strobe drive signal and a passive network 17 for producing the strobe sense signal. Network 17 includes a resistor 17a, and capacitors 17b and 17c connected in series to provide an AC path to ground for the strobe drive signal. The strobe sense signal is produced at the junction between the two capacitors in response to the strobe drive signal.

The time base circuit 10 also includes a trigger generator 16 for producing a trigger signal (TRIG) selectively upon detection of a triggering event ("INT TRIG") in the input waveform Vin (an "internal trigger source") upon detection of a triggering event ("EX TRIG") in a waveform from an external trigger source, or upon detection of the strobe sense signal produced by the strobe control circuit 14. The trigger signal generated by the trigger generator 16 is applied as input to a strobe drive circuit 18 which produces the strobe drive signal an adjustable delay time following receipt of the trigger signal.

During a sampling operation, the trigger generator 16 selects either the internal or the external trigger source to initiate the trigger signal upon detection of a triggering event and the strobe drive circuit 18 produces a single strobe drive signal following the trigger signal by a predetermined delay time. The strobe drive signal causes the strobe control circuit 14 to generate a single strobe pulse which in turn causes the gate 12 to sample the input waveform Vin.

The time base circuit 10 includes provisions for calibrating the sample delay time between the triggering event and initiation of the strobe signal. During a calibration operation, the trigger generator 16 is set to produce the trigger signal in response to the strobe sense signal from the strobe control circuit 14 rather than in response to a triggering event in the internal or external trigger source. The trigger generator 16 produces an initial trigger signal to initiate a first strobe drive signal which in turn initiates a first strobe sense signal. The first strobe sense signal causes the trigger generator to generate a second trigger signal which in turn initiates a second strobe drive signal. As the process continues, the time base circuit 10 acts like an oscillator producing trigger, strobe drive and strobe sense signals periodically.

The period between successive strobe drive signals is measured by a period timer 20 which provides data to a microprocessor (MPU) 22 indicating the period duration. The microprocessor 22 then adjusts the signal delay of the strobe drive circuit 18 according to the period data provided by the period timer 20 to calibrate the period between successive strobe signals to a predetermined delay time. When the trigger generator 16 subsequently produces a trigger signal in response to a triggering event in the external or internal sources, the strobe signal follows the triggering event by the predetermined delay time. When the delay time is regularly recalibrated in this fashion between sampling operations, fluctuations in strobe signal timing due to ambient temperature changes or other factors are substantially eliminated.

The trigger generator 16 includes a trigger select circuit 24, a trigger recognizer 26, and a holdoff counter circuit 28. The external and internal trigger sources are applied as inputs to the trigger select circuit 24 which transmits a selected one of its inputs to the trigger recognizer 26 according to selection control signals (SEL) provided by a microprocessor 22. The trigger select circuit 24 also produces the first trigger signal during a calibration operation in response to a trigger control signal ("MPU TRIG") from the microprocessor 22. The trigger recognizer 26 suitably comprises a programmable level detector which produces the trigger signal as the output signal of the trigger select circuit 24 rises above or falls below a particular voltage level, the voltage level being predetermined by data from the microprocessor 22. The trigger signal output of the trigger recognizer 26 is applied as input to the holdoff counter circuit 28 causing the counter to reset its current count to zero, to begin transmitting an inhibit signal to the trigger recognizer 26, and to begin counting cycles of a periodic signal Vs generated by the strobe drive circuit 18. The inhibit signal prevents the trigger recognizer 26 from producing a subsequent trigger signal. When the holdoff counter has counted a predetermined number of cycles of the Vs signal, it stops transmitting the inhibit signal to the trigger recognizer 26 and the trigger recognizer is thereupon armed to produce another trigger signal when it recognizes another triggering event. The count limit of the holdoff counter circuit 28 is set by data from the microprocessor 22 and is normally set high enough to ensure that a strobe signal is generated before the trigger generator produces another trigger signal.

The strobe drive circuit 18 includes a triggerable voltage controlled oscillator (VCO) 30, a programmable counter 32, a programmable delay circuit 34, and a digital to analog converter (DAC) 36. The VCO 30 produces the previously mentioned periodic signal Vs of frequency controlled by the output voltage Vc of DAC 36. The magnitude of this control voltage Vc is determined by data from microprocessor 22 applied as input to DAC 36. The trigger signal from the trigger generator 16 "triggers" VCO 30 in that the trigger signal stops the VCO and restarts it, with predetermined phase, at a fixed time after the occurrence of the trigger signal. The trigger signal output of trigger generator 16 is also applied to a "clear" input of counter 32 and causes the counter to reset its current count to zero. The programmable counter 32 then counts cycles of the VCO 30 output signal Vs starting with the first cycle following the trigger signal and transmits an output pulse to the programmable delay circuit 34 when the number of Vs cycles counted reaches a predetermined count limit. The count limit is provided as input data to the programmable counter 32 from microprocessor 22. The programmable delay circuit 34 delays the output pulse produced by the programmable counter 32 by an adjustable amount, as determined by data from the microprocessor 22, and the delayed pulse output of the programmable delay circuit 34 is applied to the strobe control circuit 14 as the strobe drive signal output of the strobe drive circuit 18.

The delay between the trigger signal and the strobe drive signal is equal to the count limit of the programmable counter 32 divided by the frequency of the output signal Vs of VCO 30 in combination with the delay of programmable delay circuit 34. To grossly adjust the delay between the trigger signal and the strobe drive signal, the microprocessor 22 adjusts the count limit of programmable counter 32 and to finely adjust the delay, the microprocessor 22 adjusts the delay of programmable delay circuit 34.

When the delay between the triggering event and the strobe signal is to be measured for calibration purposes, the microprocessor 22 switches the trigger select circuit 24 so that the strobe sense signal from the strobe control circuit 14 is applied to the trigger recognizer 26. The microprocessor 22 then transmits an MPU TRIG signal to the trigger select circuit 24, causing the trigger select circuit to transmit a pulse to the trigger recognizer 26. This pulse causes the trigger recognizer 26 to send a first trigger signal to the strobe drive circuit 18. After a delay determined by the count limit of programmable counter 32 and the programmable delay of delay circuit 34, the strobe drive circuit 18 produces a first strobe drive pulse. This first strobe drive pulse causes the strobe control circuit 14 to produce a first strobe sense pulse. Since the trigger select circuit 24 passes a strobe sense pulses to the trigger recognizer 26, the trigger recognizer generates a second trigger signal which causes the strobe drive circuit 18 to generate a second strobe drive pulse. As the process continues the time base circuit 10 acts as an oscillator, periodically producing trigger, strobe drive and strobe sense signals. The period between strobe sense signals is substantially equal to the delay between a triggering event and a strobe signal when the trigger select circuit 24 is subsequently switched to select the internal or external trigger sources.

The period timer 20 includes a frequency divider 37, a crystal oscillator 38, a gate circuit 40, and an event counter 42. The strobe drive signal is provided as input to the frequency divider 37 which drives its output signal low when it receives a first strobe drive signal pulse and drives its output high after it has received, for example, 1000 subsequent strobe drive signal pulses. A multiplexer 44 transmits the output signal of frequency divider 37 to a control input of gate 40 and another multiplexer 46 transmits the periodic output signal of the crystal oscillator 38 to a signal input of gate 40. When the control input of gate 40 is driven low, gate 40 transmits the crystal oscillator output signal to event counter 42 and when the control input of gate 40 is driven high, the gate blocks transmission of the oscillator output signal to counter 42.

The count in counter 42 and the operation of frequency divider 37 are reset by signals from the microprocessor 22 prior to a calibration operation. After the first strobe drive pulse is generated, frequency divider 37 drives its output low causing gate 40 to connect the output signal of crystal oscillator 38 (suitably operating at approximately 200 MHz) to the input of the event counter 42. Event counter 42 then begins counting cycles of the crystal oscillator 38 output signal. After 1000 more strobe drive pulses have been generated by the strobe drive circuit 18, frequency divider 37 drives its output high causing gate 40 to disconnect the oscillator 38 output signal from event counter 42. Thereafter the microprocessor 22 reads the count in counter 42 and divides the count by 1000 and by the frequency of the output signal of crystal oscillator 38 to determine a strobe signal delay time resulting from the current adjustments of the programmable counter 32 and delay circuit 34 of the strobe drive circuit 18. The microprocessor 22 may then adjust the count limit of programmable counter 32, and/or the delay time of delay circuit 34 to increase or decrease the strobe signal delay time and may repeat the measurement and delay adjustment operations as necessary to accurately calibrate the strobe signal delay time to a predetermined value.

The period timer 20 also enables the microprocessor 22 to calibrate the frequency of the triggerable VCO 30 of the strobe drive circuit 18. The output signal Vs of VCO 30 is connected to a second input of multiplexer 46. The output signal of crystal oscillator 38 is frequency divided (for instance by a factor of $10^6$) by another frequency divider 48 and the output of frequency divider 48 is applied to a second input of multiplexer 44. To calibrate the frequency of the triggerable VCO output signal, the microprocessor 22 switches multiplexers 44 and 46 such that the output of frequency divider 48 controls the operation of gate 40 and such that Vs is applied as the signal input to gate 40. Prior to a measurement operation, frequency divider 48 and counter 42 are reset by signals from microprocessor 22. Thereafter the output of frequency divider 48 is driven low for $10^6$ cycles of crystal oscillator 38, enabling gate 40 to transmit Vs to event counter 42 for that time. The counter 42 counts cycles of Vs during that time and thereafter the microprocessor 22 reads the count, computes the VCO 30 output signal frequency from the count and alters the data applied plied to DAC 36 to adjust the VCO signal frequency. The measurement and adjustment process may continue iteratively until the VCO signal frequency is accurately calibrated.

The programmable counter 32 and the programmable delay circuit 34 may be of the form described in copending application Ser. No. 846,320, entitled "Tunable Delay Line" filed Mar. 31, 1986, now U.S. Pat. No. 4,701,714.

The output signals provided by crystal oscillators are highly stable and are not strongly affected by changes in ambient temperature. Therefore the use of a crystal oscillator 38 to calibrate the strobe signal delay time and the VCO output frequency ensures consistency in timing circuit 10 calibration in spite of relatively large ambient temperature differences or other destabilizing effects between successive sampling operations.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A time base circuit for producing a strobe signal following detection of a triggering event in a waveform, the time base circuit comprising:
 a trigger generator for generating a trigger signal selectively in response to one of said triggering event and a strobe sense signal;
 means responsive to said trigger signal for producing the strobe signal and the strobe sense signal an adjustable delay time following said trigger signal; and
 means for measuring a period between successive strobe signals produced when the trigger generator generates trigger signals in response to strobe sense signals and adjusting said adjustable delay time such that said period has predetermined value.

2. A time base circuit for producing a strobe signal following a triggering event in a waveform, the time base circuit comprising:
 a trigger generator for generating a trigger signal selectively in response to one of said triggering event and a strobe sense signal;
 a strobe drive circuit responsive to said trigger signal for producing a strobe drive signal an adjustable delay time after said trigger generator generates said trigger signal;
 a strobe control circuit for producing said strobe signal and said strobe sense signal in response to said strobe drive signal produced by said strobe drive circuit; and
 control means for measuring a period between successive strobe drive signals produced by said strobe drive circuit when said trigger generator generates trigger signals in response to strobe sense signals and for adjusting said adjustable delay time of said strobe drive circuit so that a period between successive strobe drive signals measured by said measuring means is of a predetermined duration time.

3. The time base circuit according to claim 2 wherein said strobe drive circuit comprises:
 oscillator means responsive to said trigger signal for generating a periodic oscillator output signal, said periodic oscillator output signal being stopped and restarted by said trigger signal; and
 counter means for producing a counter output signal upon counting an adjustable number of cycles of said periodic oscillator output signal, said control means adjusting said adjustable delay time by adjusting the number of oscillator output signal cycles to be counted by said counter means.

4. The time base circuit according to claim 3 wherein said strobe drive circuit further comprises signal delay means for adjustably delaying said counter output signal, said control means further adjusting said adjustable delay time by adjusting the counter output signal delay of said signal delay means.

5. A time base circuit for producing a strobe signal following a triggering event in a waveform, the time base circuit comprising:
 a trigger generator for generating a trigger signal in response to said triggering event;
 a voltage controlled oscillator responsive to said trigger signal for generating a periodic signal wherein said periodic signal is stopped and restarted by said trigger signal, the frequency of said periodic signal being determined according to the magnitude of a control voltage applied to said voltage controlled oscillator;
 means for counting cycles of said periodic signal following said trigger signal and for producing an output signal when the count reaches a predetermined limit;
 means for receiving said output signal and for producing a strobe drive signal at an adjustable delay time following production of said output signal; and
 means for producing said strobe signal in response to said strobe drive signal.

6. The apparatus according to claim 5 further comprising:
 frequency measuring means for producing data indicating the frequency of said periodic oscillator output signal; and
 means responsive to said data for adjusting the magnitude of said control voltage to set the frequency of said periodic signal to a predetermined value.

7. The apparatus according to claim 6 wherein said frequency measuring means comprises:
 a crystal controlled oscillator for producing a repetitive reference signal at a predetermined frequency; and
 means for counting the number of periods of said periodic signal occurring during a predetermined number of repetitions of said reference signal and for producing said data indicating said counted number of periods of said periodic signal.

* * * * *